(12) United States Patent
Yun et al.

(10) Patent No.: US 10,368,452 B2
(45) Date of Patent: Jul. 30, 2019

(54) FOLDABLE DISPLAY DEVICE

(71) Applicant: LG Display Co., Ltd., Seoul (KR)

(72) Inventors: Young-Joon Yun, Paju-si (KR); Dai-Yun Lee, Gimpo-si (KR); Seung-O Jeon, Seoul (KR); Shin-Suk Lee, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/855,931

(22) Filed: Dec. 27, 2017

(65) Prior Publication Data

US 2018/0192527 A1 Jul. 5, 2018

(30) Foreign Application Priority Data

Dec. 30, 2016 (KR) ........................ 10-2016-0184367

(51) Int. Cl.
| | |
|---|---|
| *G06F 1/16* | (2006.01) |
| *H05K 5/00* | (2006.01) |
| *G09F 9/30* | (2006.01) |

(52) U.S. Cl.
CPC ......... *H05K 5/0017* (2013.01); *G06F 1/1652* (2013.01); *G09F 9/301* (2013.01)

(58) Field of Classification Search
CPC .................................................. G06F 1/1652
See application file for complete search history.

(56) References Cited

U.S. PATENT DOCUMENTS

| | | | | |
|---|---|---|---|---|
| 6,577,496 B1* | 6/2003 | Gioscia | ................ | G06F 1/1616 345/156 |
| 9,729,688 B2* | 8/2017 | Lee | ...................... | H04M 1/0279 |
| 9,791,892 B2* | 10/2017 | Park | ..................... | G06F 1/1652 |
| 10,013,028 B2* | 7/2018 | Ahn | ..................... | H04M 1/0268 |
| 2014/0029171 A1* | 1/2014 | Lee | ......................... | H05K 7/16 361/679.01 |
| 2014/0126133 A1* | 5/2014 | Griffin | .................. | G06F 1/1616 361/679.27 |
| 2014/0196254 A1* | 7/2014 | Song | ........................ | E05D 3/14 16/302 |
| 2014/0226275 A1* | 8/2014 | Ko | ......................... | G06F 1/1626 361/679.27 |
| 2014/0355195 A1* | 12/2014 | Kee | ...................... | G06F 1/1616 361/679.27 |
| 2015/0177789 A1* | 6/2015 | Jinbo | .................... | G06F 1/1652 313/511 |
| 2018/0070460 A1* | 3/2018 | Han | ..................... | G06F 1/1652 |
| 2018/0077810 A1* | 3/2018 | Moon | .................. | G06F 1/1618 |

* cited by examiner

*Primary Examiner* — Anthony Q Edwards
(74) *Attorney, Agent, or Firm* — Fenwick & West LLP

(57) ABSTRACT

A foldable display device that reduces a transfer or distortion phenomenon of a folding part, prevents a display panel from sagging, and exhibits excellent folding characteristics. The foldable display device includes a display panel including a folding part and a non-folding part, a plurality of middle frames disposed at the lower surface of the display panel, and a bottom case for receiving the display panel and the middle frames. Each of the middle frames includes a frame folding part located at a region corresponding to the folding part of the display panel and a plurality of plates located at a region corresponding to the non-folding part of the display panel.

21 Claims, 5 Drawing Sheets

FOLDABLE DISPLAY DEVICE

This application claims the benefit of Korean Patent Application No. 10-2016-0184367, filed on Dec. 30, 2016, which is hereby incorporated by reference as if fully set forth herein.

BACKGROUND OF THE INVENTION

Field of the Invention

The present invention relates to a foldable display device, and more particularly to a foldable display device that is capable of increasing the support force of a display panel in the vertical direction and minimizing the stress applied to a folding part when folded.

Discussion of the Related Art

Image display devices are a core technology in the information and communication age for displaying various kinds of information on a screen. Image display devices have been developed such that they are thinner, lighter, and portable and exhibit high performance. Organic light-emitting display devices control the amount of light that is emitted from an organic light-emitting layer to display an image. Organic light-emitting display devices have been highlighted as flat panel display devices, which are lighter and smaller than cathode ray tubes (CRT).

In an organic light-emitting display device, a plurality of pixels are arranged in the form of a matrix to display images. Each pixel includes a light-emitting device, and the organic light-emitting display device includes a pixel drive circuit including a plurality of transistors configured to independently drive the respective light-emitting device of each pixel.

Using a self-emitting organic light-emitting device, an organic light-emitting display device does not need an additional light source, and may be realized as an ultra-thin display device. In recent years, therefore, research has been actively conducted into an in-cell touch type foldable display device, which uses an organic light-emitting device and includes a touch electrode array in a light-emitting cell.

A foldable display device has a structure in which the display device itself, including a display panel, is foldable. In order to protect such a flexible display panel, a middle frame is provided. The middle frame, which is provided at the lower surface of the display panel to protect the display panel, must be designed to be foldable.

In a conventional foldable display device, the region of a middle frame corresponding to the folding part has a soft structure including silicone resin, and the remaining region of the middle frame corresponding to a non-folding part is made of metal or rigid plastic to protect the display panel.

In the conventional foldable display device using the middle frame, the folding part and the non-folding part are formed of different materials. The materials are different from each other in terms of their physical properties, such as rigidity, elasticity, and softness. In addition, the material is compressed differently during the processing. As a result, there is a high possibility of irregularities being formed at the interface between the different materials. When the irregularities are formed between the folding part and the non-folding part, a display screen may become transferred or distorted. In addition, when the conventional foldable display device using the middle frame is folded multiple times, the soft folding part is stressed, with the result that the display panel may swell or sag. Furthermore, the soft folding part may be deformed or hardened under high-temperature, high-humidity conditions.

SUMMARY OF THE INVENTION

Accordingly, the present invention is directed to a foldable display device that substantially obviates one or more problems due to limitations and disadvantages of the related art.

An object of the present invention is to provide a foldable display device that reduces a transfer or distortion phenomenon of a folding part, prevents a display panel from sagging, and exhibits excellent folding characteristics.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In one embodiment, a foldable display device includes a display panel including at least one folding part and at least two non-folding parts, a plurality of middle frames disposed at the lower surface of the display panel, and a bottom case for receiving the display panel and the middle frames. Each of the middle frames includes a frame folding part located at a region corresponding to the folding part of the display panel and a plurality of plates located at regions corresponding to the non-folding parts of the display panel.

The frame folding part may include a folding pattern including a plurality of bars arranged in parallel to a folding axis, about which the display panel is folded, and an opening pattern including a plurality of slits alternating with the bars of the folding pattern. The opening patterns provided at one of the middle frames may be misaligned with the opening patterns provided at another one of the middle frames.

The main frame may include an extension that extends from one side thereof further than the sub frame, and the extension may be held by a protrusion formed on the bottom case. A frame folding part of the sub frame and a plate of the sub frame that is adjacent to the protrusion may independently slip relative to an adjacent one of the middle frames at the time of folding.

In another embodiment, a foldable display device comprises a display panel, main frame, a first sub-frame, and a bottom cover. The display panel includes a first folding part, a first non-folding part and a second non-folding part, the first non-folding part extending in a first direction from the first folding part and the second non-folding part extending in a second direction from the first folding part opposite the first direction. The display panel is configured to be folded along a folding axis within the first folding part. The main frame is attached to a lower surface of the display panel. The main frame includes a second folding part, a first non-folding plate and a second non-folding plate, the first non-folding plate extending in the first direction from the second folding part and the second non-folding plate extending in the second direction from the second folding part. The first sub-frame is under the main frame and includes a third folding part, a third non-folding plate and a fourth non-folding plate. The third non-folding plate extends in the first direction from the third folding part and the fourth non-folding plate extends in the second direction from the third folding part. The bottom case receives the display panel, the main frame, and the first sub-frame. The display panel and the first non-folding plate of the main frame extend longer in the first direction than the third non-folding plate of the first sub-frame. The fourth non-folding plate of the first sub-frame is attached to the second non-folding plate of the main frame. The third folding part of the first sub-frame is not attached to the second folding part of the main frame. The third non-folding plate of the first sub-frame is not attached to the first non-folding plate of the main frame.

The bottom case may comprise a protrusion protruding toward and supporting an extension part of the first non-folding plate of the main frame extending longer in the first direction than the third non-folding plate of the first sub-frame. The extension part of the first non-folding plate of the main frame is attached to the protrusion of the bottom case.

The third folding part and the third non-folding plate of the first sub-frame slip in the first direction relative to the main frame when the foldable display device is folded along the folding axis.

The second folding part of the main frame includes a plurality of first bars arranged along the folding axis and a plurality of first slits alternating with the first bars. The third folding part of the first sub-frame includes a plurality of second bars arranged along the folding axis and a plurality of second slits alternating with the second bars. The first bars of the main frame are misaligned with the second bars of the first sub-frame.

In some embodiments, the first sub-frame includes a support layer disposed on a surface of, and supporting, the third folding part, the third non-folding plate, and the fourth non-folding plate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
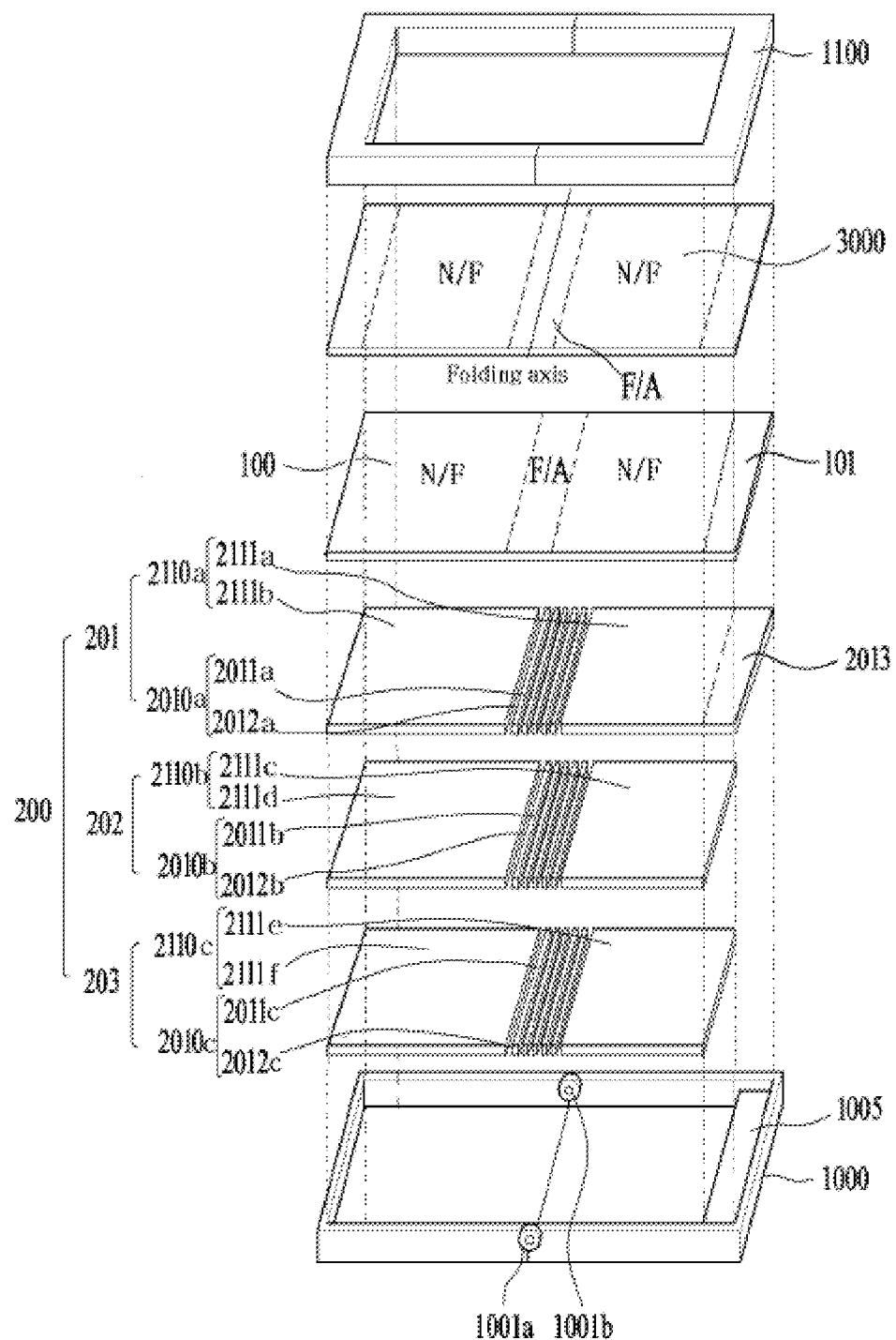
FIG. 1 is an exploded perspective view of a foldable display device according to an embodiment of the present invention.

Reference will now be made in detail to the preferred embodiments of the present invention, examples of which are illustrated in the accompanying drawings. Wherever possible, the same reference numbers will be used throughout the drawings to refer to the same or like parts. In the following description of the present invention, a detailed description of known functions and configurations incorporated herein will be omitted when it may obscure the subject matter of the present invention. In addition, the terms used in the following description are selected in consideration of ease of preparation of the specification, and may be different from the names of parts constituting an actual product.

It will be understood that when an element is referred to as being "on" another element, it may be directly on the element, or one or more intervening layers or elements may also be present therebetween. In contrast, it will be understood that when an element is referred to as "contacting" another element, no intervening elements or layers are present therebetween.

The size and thickness of each element shown in the drawings are given merely for the convenience of description, and the present invention is not limited thereto.

FIG. 1 is an exploded perspective view of a foldable display device according to an embodiment of the present invention.

The foldable display device according to the present invention includes a display panel 100 including at least one foldable folding part F/A and at least two non-folding parts N/F, which are the remaining regions excluding the foldable folding part F/A, a cover window 3000 laminated to the upper surface of the display panel, the cover window 3000 including a folding part F/A corresponding to the folding part F/A of the display panel 100 and non-folding parts N/F corresponding to the non-folding parts N/F of the display panel 100, a plurality of middle frames 200 laminated to the lower surface of the display panel 100, a bottom case 1000 for receiving the display panel 100, the cover window 3000, and the middle frames 200, and a top case 1100 fastened to the bottom case 1000, the top case 1100 disposed on the cover window 3000 to cover the edge of a top surface of the cover window 3000.

The folding part F/A of the display panel 100 is flexible, i.e. foldable. The non-folding parts N/F of the display panel 100 are formed so as to have higher rigidity than the folding part F/A. However, the present invention is not limited thereto. Depending on the design, the folding part F/A and the non-folding parts N/F of the display panel 100 may be formed so as to be flexible, and the portions of the middle frames 1000 corresponding to the non-folding parts N/F may be rigid to thus support the non-folding parts N/F of the display panel 100.

The non-folding parts N/F of the display panel 100 may be located parallel to the folding axis of the folding part F/A, and may be located at opposite sides of the folding part F/A.

The display panel 100, which is flexible, displays images. In one embodiment, the display panel 100 is an organic light-emitting display panel. However, the present invention is not limited thereto. Various kinds of display panels, such as a liquid crystal display panel and an electrophoretic display panel, may be used. Images displayed on the display panel 100 are visible to a user through the cover window 3000.

The cover window 3000 may include a folding part F/A corresponding to the folding part F/A of the display panel 100. The folding part F/A of the cover window 3000 may include a flexible soft part. The remaining regions of the cover window 3000, i.e. the non-folding parts N/F, may include a hard part that exhibits higher rigidity than the soft part. However, the present invention is not limited thereto.

The cover window 3000 is located on the display panel 100 to protect the display panel 100 from external shocks and the external environment. The cover window 3000 may be made of a transparent material, such as glass or polymer resin.

The middle frames 200 are located at the lower surface of the display panel 100. In FIG. 1, three middle frames are shown by way of example. However, the present invention is not limited thereto. Depending on the design, the number of middle frames 200 may range from 2 to 5.

Each middle frame 200 includes a frame folding part 2010 and flat parts 2110 located at opposite sides of the frame folding part 2010. The flat parts 2110 are formed so as to include plates 2111a to 2111f. Each middle frame 200 may be made of a material that exhibits high rigidity, such as metal. However, the present invention is not limited thereto.

The frame folding part 2010 enables each middle frame 200 to be folded while supporting the folding part F/A of the display panel 100. To this end, the frame folding part 2010 includes a folding pattern 2011 and an opening pattern 2012. The opening pattern 2012 is formed by removing a portion of the material constituting each middle frame 200 such that the lower surface of the display panel 100 is exposed. The opening pattern 2012 may be linearly formed parallel to the folding axis of the display panel. That is, the opening pattern 2012 may be configured in the form of slits, which are provided parallel to the folding axis and open a portion of the lower surface of the display panel 100.

A portion of the material constituting each middle frame 200 is removed from the frame folding part 2010 in order to form the opening pattern 2012, and the remaining portion constitutes the folding pattern 2011. The folding pattern 2011 may be configured in the shape of a plurality of bars spaced apart from each other, since the opening pattern 2012 is formed linearly. However, the present invention is not limited thereto. Adjacent ones of the bars constituting the folding pattern 2011 may be partially adhered to each other, and the opening pattern 2012 may be further provided with a thin film remaining and (not shown) having a thickness less than that of each middle frame 200. In addition, the folding pattern 2011 and the opening pattern 2012 may have various forms depending on the design.

In FIG. 1, the folding pattern 2011 is exaggerated. However, the actual width of the folding pattern 2011 in the shorter direction is about 0.3 mm or less, which is very small. The opening pattern 2012 has a small width of about 0.1 mm in the shorter direction. That is, the folding pattern 2011 and the opening pattern 2012 are micro patterns.

Since the folding pattern 2011 and the opening pattern 2012 are formed so as to have micro-scale sizes, the folding part F/A of the display panel 100 is effectively supported by the folding pattern 2011 in the unfolded state. In the folded state, on the other hand, the bars of the folding pattern 2011, which are separated from each other by the opening pattern 2012, are independently folded along the display panel 100 (i.e., along the longer direction of each bar of the folding pattern 2011) without applying stress to each other. Consequently, the bars of the folding pattern 2011 support the display panel 100 with minimized stress when the display panel 100 is folded, and enable each middle frame 200 to be easily folded.

The plates 2111a to 2111f of the flat parts 2110 are located so as to correspond to the lower surface of the non-folding parts N/F of the display panel 100. Each of the plates 2111a to 2111f is made of a material that exhibits high rigidity, such as metal, to support the display panel 100 and to protect the display panel 100 from external shocks. The flat parts 2110 are located at opposite sides of the frame folding part 2010.

Consequently, the plates 2111a to 2111f provided at the flat parts 2110 are also located at opposite sides of the frame folding part 2010.

The plates 2111a to 2111f are located to correspond only to the lower surface of the non-folding parts N/F of the display panel 100, whereby the plates 2111a to 2111f do not extend to or overlap with the folding parts F/A of the display panel 100 and as such the folding of the display panel 100 is not affected.

In this specification, one of the middle frames 200 that contacts the lower surface of the display panel 100 is defined as a main frame 201, and the other middle frames 200 are defined as sub frames 202 and 203. One of the sub frames that contacts the main frame 201 is defined as a first sub frame 202, and the other sub frame is defined as a second sub frame 203.

The main frame 201 has the same length and width as the display panel 100 such that the main frame 201 is laminated to the entire lower surface of the display panel 100. Although not shown, a first adhesive layer is provided between the main frame 201 and the display panel 100. The first adhesive layer is provided on the entire lower surface of the display panel 100 to laminate the main frame 201 to the display panel 100. The main frame 201 includes a first frame folding part 2010a and first flat parts 2110a. The first frame folding part 2010a is located so as to correspond to the folding part F/A of the display panel 100, and the first flat parts 2110a are located so as to correspond to the non-folding parts N/F of the display panel 100.

The first flat parts 2110a include a first plate 2111a and a second plate 2111b. In addition, the first frame folding part 2010a includes a first folding pattern 2011a and a first opening pattern 2012a, which have the previously described characteristics of the folding pattern and the opening pattern.

The first sub frame 202 is laminated to the lower surface of the main frame 201. The first sub frame 202 includes a second frame folding part 2010b and second flat parts 2110b.

The second frame folding part 2010b includes a second folding pattern 2011b and a second opening pattern 2012b, which have the previously described characteristics of the folding pattern and the opening pattern. The second flat parts 2110b include a third plate 2111c and a fourth plate 2111d.

The second sub frame 203 may be laminated to the lower surface of the first sub frame 202. In the case in which a plurality of second sub frames 203 are provided, the second sub frames 203 may be laminated to each other.

The second sub frame 203 includes a third frame folding part 2010c and third flat parts 2110c. The third frame folding part 2010c includes a third folding pattern 2011c and a third opening pattern 2012c, which have the previously described characteristics of the folding pattern and the opening pattern. The third flat parts 2110c include a fifth plate 2111e and a sixth plate 2111f.

The first and second sub frames 202 and 203 are formed so as to have a length less than that of the display panel 100 and the main frame 201. Referring to FIG. 1, one of the plates 2111c to 2111f provided at the flat parts 2110b and 2110c of the first and second sub frames 202 and 203, respectively (e.g. the third plate 2111c of the first sub frame 202 and the fifth plate 2111e of the second sub frame 203) are formed so as to have a length less than that of one of the plates of the main frame 201, which is located above the first and second sub frames 202 and 203 (e.g. the first plate 2111a). That is, the display panel 100 includes a first extension 101 that extends from one side thereof further than the first and second sub frames 202 and 203. In addition, one of the plates 2111a and 2111b of the main frame 201, e.g. the first plate 2111a, also includes a second extension 2013 that extends from one side thereof further than the first and second sub frames 202 and 203. The first and second extensions 101 and 2013 are held by a protrusion 1005 of the bottom case 1000 to support the main frame 201 and the display panel 100, which will be described in detail when describing the bottom case 1000.

The bottom case 1000 receives therein the middle frames 200, the display panel 100, and the cover window 3000. The bottom case 1000 includes a first hinge 1001a and a second hinge 1001b, which are provided so as to correspond to the folding part F/A of the display panel 100 to fold the display panel 100. The hinges 1001a and 1001b are located so as to correspond to opposite sides of the folding part F/A of the display panel 100 such that the bottom case 1000 can be folded when the middle frames 200, the display panel 100, and the cover window 3000 are folded. However, the present invention is not limited thereto. In the case in which the hinges 1001a and 1001b are located so as to correspond to opposite sides of the folding part F/A of the display panel 100, the bottom case 1000 may be configured such that the bottom case 1000 is divided into two separate parts, which rotate around the hinges 1001a and 1001b in opposite directions (i.e., counterclockwise and clockwise) when folded.

The bottom case 1000 is provided with a protrusion 1005 at the bottom surface of the portion corresponding to the lower side of the extensions 101 and 2013 of the display panel 100 and the main frame 201, respectively. The protrusion 1005 is adhered to the second extension 2013 of the main frame 201 to support and fix the first extension 101 of the display panel 100 and the second extension 2013 of the main frame 201.

The plates of the sub frames 202 and 203 located opposite the protrusion 1005, e.g. the fourth plates 2111d and the sixth plates 2111f, are laminated to other adjacent middle frames 201, 202, and 203. Referring to FIG. 1, the first sub frame 202 is laminated to the main frame 201 and to the second sub frame 203. The fourth plate 2111d of the first sub frame 202 is laminated to the second plate 2111b of the main frame 201. In addition, the fourth plate 2111d is also laminated and fixed to the sixth plate 2111f of the second sub frame 203, which is located at the lower side of the first sub frame 202.

The second sub frame 203 is laminated to the first sub frame 202. The sixth plate 2111f of the second sub frame 203 is laminated to the fourth plate 2111d of the first sub frame 202.

An additional second sub frame may be further provided at the lower side of the second sub frame 203. In this case, the sixth plate 2111f may be laminated to an adjacent plate of the additional second sub frame.

Alternatively, in the case in which the second sub frame 203 contacts the bottom surface of the bottom case 1000, the sixth plate 2111f is laminated to the bottom surface of the bottom case 1000.

Consequently, only the plates of the first and second sub frames 202 and 203 that are located opposite the protrusion 1005, e.g. the fourth plate 2111d of the first sub frame 202 and the sixth plate 2111f of the second sub frame 203, are supported and fixed. The other plates, which are located adjacent to the protrusion 1005, e.g. the third plate 2111c and the fifth plate 2111e of the first sub frame 202, the second frame folding part 2010b of the first sub frame 202, and the third frame folding part 2010c of the second sub frame 203 are not fixed using the adhesive layer but independently slip in response to folding of the middle frames 201, 202, and 203, i.e. the main frame 201 and the first and second sub frames 202 and 203.

On the other hand, one side of the display panel 100 and the main frame 201 is attached to the fourth plate 2111d of the first sub frame 202, which is located opposite the protrusion 1005, and the other side of the display panel 100 and the main frame 201 is attached to the protrusion 1005. Since the fourth plate 2111d is attached to the sixth plate 2111f of the second sub frame 203 and the sixth plate 2111f is attached to the bottom surface of the bottom case 1000, as described above, the first plate 2111a of the main frame 201 of the display panel 100 is attached to the protrusion 1005, and the second plate 2111b of the main frame 201 of the display panel 100 is fixed to the bottom surface of the bottom case 1000 via the fourth and sixth plates 2111d and 2111f of the sub frames 202 and 203, which are located under the main frame 201. As a result, the entirety of the main frame 201 is fixed and thus does not slip.

To this end, although not shown in FIG. 1, adhesive layers (not shown) may be further provided between the display panel 100 and the main frame 201, between one of the plates of the main frame 201, e.g. the second plate 2111b, and one of the plates of the first sub frame 202, e.g. the fourth plate 2111d, and between the plates of the first and second sub frames 202 and 203, e.g. the fourth plate 2111d and the sixth plate 2111f. The structure of the main frame 201 and the sub frames 202 and 203 will be described below in detail.

The top case 1100 can be folded simultaneously when the display panel 100 is folded. To this end, the region of the top case 1100 corresponding to the folding part F/A of the display panel 100 may be configured to be foldable. For example, the top case 1100 may be configured such that the top case 1100 is divided into two parts about the region thereof corresponding to the folding part F/A of the display panel 100, may be made of a flexible material, or may be provided with an additional hinge (not shown), about which the top case 1100 is foldable. However, the present invention is not limited thereto.

Figure 2A:
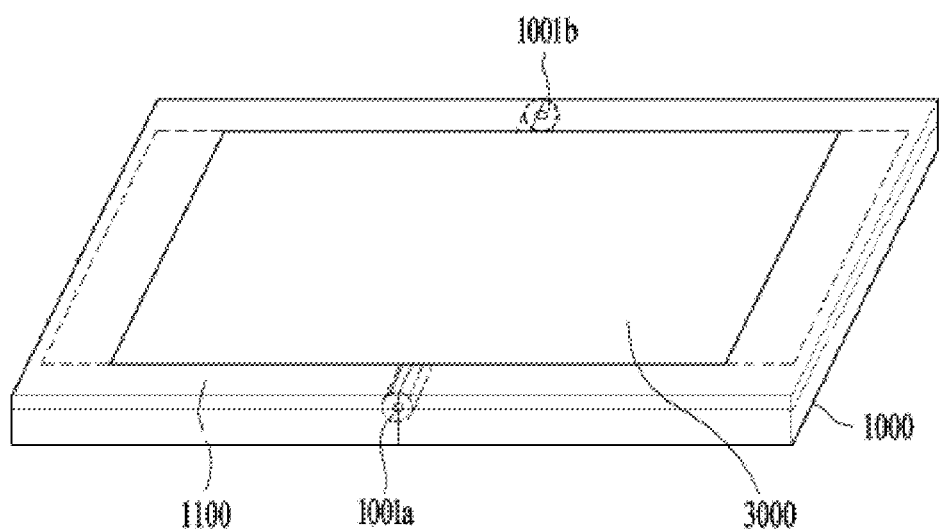
FIG. 2A is a schematic view illustrating the assembled structure of the foldable display device shown in FIG. 1.
Figure 2B:
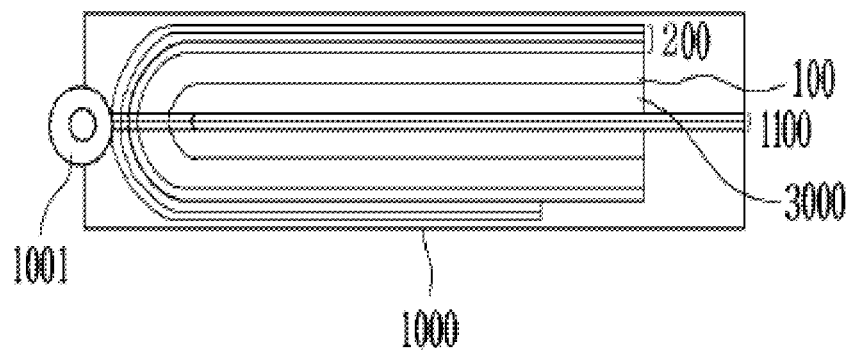
FIG. 2B is a schematic view illustrating the form of the foldable display device shown in FIG. 2A when folded.

FIG. 2A is a schematic view illustrating the assembled structure of the foldable display device shown in FIG. 1, and FIG. 2B is a schematic view illustrating the form of the foldable display device shown in FIG. 2A when folded.

When the foldable display device according to the present invention is assembled, as shown in FIG. 2A, the cover window 3000 is visible through the bottom case 1000, the top case 1100, and the central part of the foldable display device, at which the top case 1100 is not formed.

Although not shown in FIG. 2A, the display panel 100 is located at the lower side of the cover window 3000, and displays images through the cover window 3000. The hinge 1001a provided at the bottom case 1000 may be alternatively located in the top case 1100 so as not to be visible, or may protrude outward from the top case 1100. However, the present invention is not limited thereto. Since it is also necessary for the top case 1100 to be folded, the top case 1100 may be divided into two parts about the hinge 1001a, the region of the top case 1100 corresponding to the folding part F/A of the display panel 100 may be made of a flexible material, or the top case 1100 may be provided with an additional hinge (not shown). However, the present invention is not limited thereto.

The bottom case 1000 may be formed so as to be divided into two parts about the hinge 1001a.

Since the bottom case 1000 and the top case 1100 are configured as described above, the bottom case 1000 and the top case 1100 may be folded simultaneously with the display panel 100, the cover window 3000, and the middle frames 2000 when the foldable display device according to the present invention is folded as shown in FIG. 2B.

Figure 3:
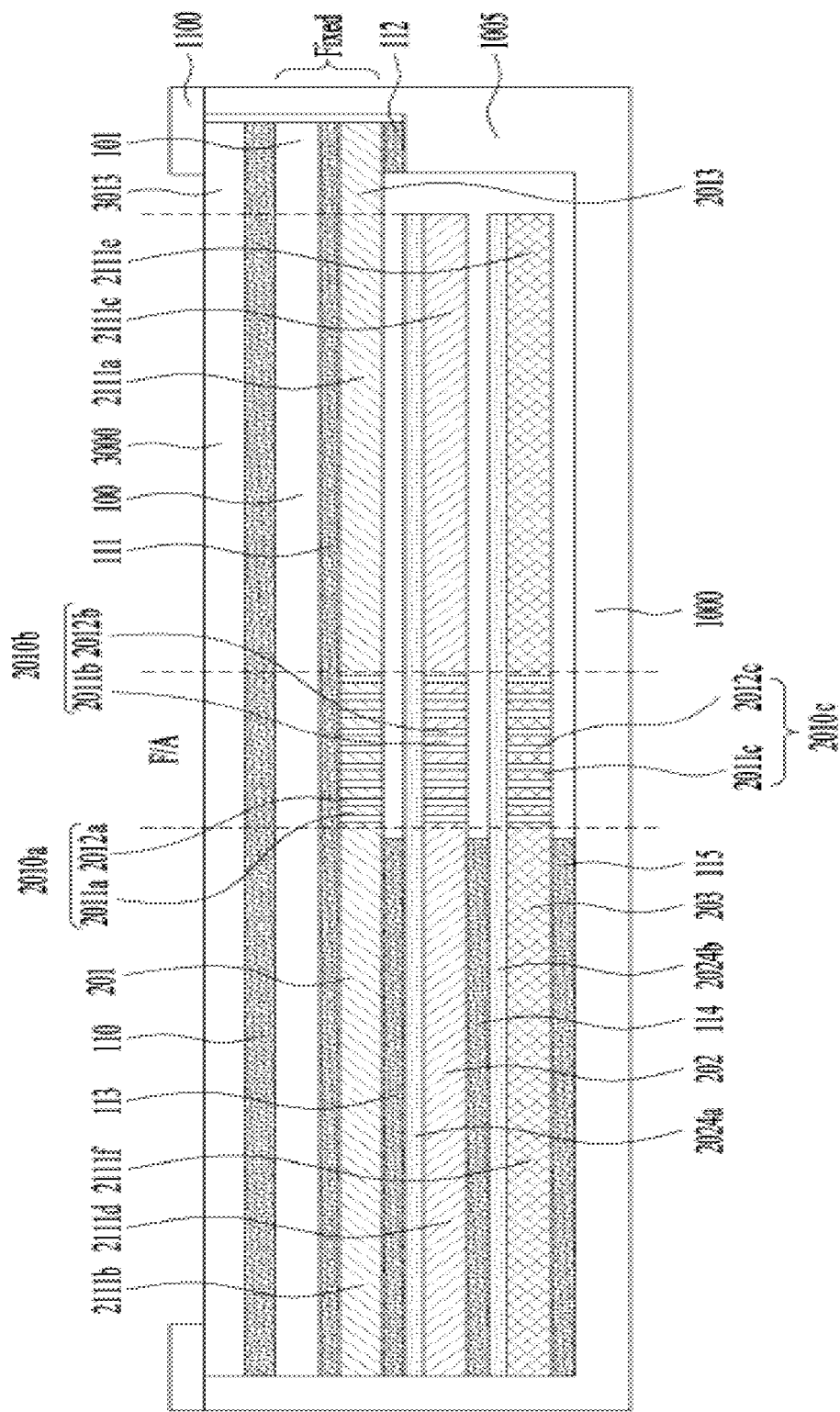
FIG. 3 is a sectional view of the foldable display device according to an embodiment of the present invention, illustrating the position and coupling relationship of middle frames in detail.

FIG. 3 is a sectional view of the foldable display device according to the present invention, illustrating the position and coupling relationship of the middle frames 200 in detail.

Referring to FIG. 3, the second sub frame 203, the first sub frame 202, the main frame 201, the display panel 100, and the cover window 300 are sequentially stacked in the bottom case 1000. The cover window 300 and the display panel 100 are laminated to each other via a panel adhesive layer 110. The edges of the display panel 100 and the cover window 300 are covered by the top case 1100. The top case 1100 serves to protect the surface of the foldable display device on which images are displayed.

The display panel 100 is laminated to the main frame 201 via a first adhesive layer 111. The first adhesive layer 111 is disposed on the entire lower surface of the display panel 1000 to securely laminate the display panel 100 to the main frame 201. The first extension 101 is provided at one side of the display panel 100 so as to protrude further than the sub frames 202 and 203. A cover extension 3013 of the cover window 3000 may be further provided at the upper side of the first extension 101 of the display panel 101.

The main frame 201 includes a frame folding part 2010 and plates 2111. One of the plates 2111, i.e. a first plate 2111a, includes a second extension 2013 protruding further than the sub frames 202 and 203 in the horizontal direction. The second extension 2013 of the main frame 201 is held by the protrusion 1005, which is defined by the bottom surface protruding from the bottom case 1000. Between the second extension 2013 of the main frame 201 and the protrusion 1005 is provided a second adhesive layer 112, via which the second extension 2013 of the main frame 201 is adhered and fixed to the protrusion 1005.

The main frame 201 includes a second plate 2111b, which is located opposite the second extension 2013 of the first plate 2111a in the horizontal direction and is spaced apart from the first plate 2111a in the state in which the first frame folding part 2010a is disposed therebetween. Each of the first and second plates 2111a and 2111b may be made of a material that exhibits high rigidity, such as metal. The first plate 2111a, the second plate 2111b, and the first frame folding part 2010a are laminated to the display panel 1000 via the first adhesive layer 111.

Since the display panel 100 is laminated to the main frame 201, the display panel 100 is also supported and fixed by the protrusion 1005 together with the main frame 201.

As previously described, the first frame folding part 2010a of the main frame 201 includes a first folding pattern 2011a and a first opening pattern 2012a. The bars of the first folding pattern 2011a may be spaced apart from each other in the state in which the bars are interposed between the respective slits of the first opening pattern 2012a. Since the bars of the first folding pattern 2011a are spaced apart from each other, the first folding pattern 2011a supports the display panel 1000 in the unfolded state, and adjacent bars of the first folding pattern 2011a do not apply stress to each other in the folded state. Consequently, the stress applied to the first frame folding part 2010a is minimized.

The first sub frame 202 includes a third plate 2111c, a fourth plate 2111d, and a second frame folding part 2010b. The second sub frame 203 includes a fifth plate 2111e, a sixth plate 2111f, and a third frame folding part 2010c.

As also mentioned with reference to FIG. 1, one of the plates 2111 of the first sub frame 202 that overlaps the first plate 2111a of the main frame 201 is defined as a third plate 2111c, and one of the plates 2111 of the first sub frame 202 that overlaps the second plate 2111b of the main frame 201 is defined as a fourth plate 2111d, for the convenience of description. In addition, one of the plates 2111 of the second sub frame 203 that overlaps the first plate 2111a is defined as a fifth plate 2111e, and one of the plates 2111 of the second sub frame 203 that overlaps the second plate 2111b is defined as a sixth plate 2111f.

The first sub frame 202 is configured such that the bars of the second folding pattern 2011b of the second frame folding part 2010b are completely divided from each other by the slits of the second opening pattern 2012b and such that second frame folding part 2010b is not attached to the first frame folding part 2010a of the main frame 201 or to the third frame folding part 2010c of the second sub frame 203. Unless the second folding pattern 2011b is fixed, the second folding pattern 2011b moves and thus cannot exhibit its function. Consequently, a first support layer 2024a may be provided on the second folding pattern 2011b and the second opening pattern 2012b to support and fix the second folding pattern 2011b such that the shape and position of the second folding pattern 2011b are maintained. The first support layer 2024a is attached to both the second frame folding part 2010b and the second flat parts 2110b to maintain the shape of the first sub frame 202.

For the same reason as the first sub frame 202, the second sub frame 203 may further include a second support layer 2024b for supporting and fixing the third flat parts 2110c and the third frame folding part 2010c.

In FIG. 3, the first and second support layers 2024a and 2024b are shown as being attached to the upper surfaces of the sub frames 202 and 203, respectively. However, the present invention is not limited thereto. The first and second support layers 2024a and 2024b may be attached to the lower surfaces of the sub frames 202 and 203, respectively.

The lower surface of the second plate 2111b of the main frame 201 is adhered to the first support layer 2024a of the first sub frame 202. The second plate 2111b of the main frame 201 is laminated to the first support layer 2024a of the first sub frame 202 via a third adhesive layer 112. The third adhesive layer 112 is located at the region that overlaps the second plate 2111b. In order words, the first plate 2111a and the first frame folding part 2010a of the main frame 201 are not adhered to the first support layer 2024a of the first sub frame 202.

Consequently, the fourth plate 2111d, which is located at the lower side of the second plate 2111b, is adhered and fixed to the second plate 2111b via the first support layer 2024a.

The third plate 2111c and the second frame folding part 2010b of the first sub frame 202 are not fixed to other elements, and thus slip in the horizontal direction in response to folding of the bottom case 1000.

Meanwhile, the second sub frame 203 may be omitted. In this case, the fourth plate 2111d of the first sub frame 202 may be laminated to the bottom surface of the bottom case 2000 via an adhesive layer. Even in this case, the adhesive layer, which is provided between the bottom surface and the fourth plate 2111d, may be located only at the region that overlaps the fourth plate 2111d. Consequently, the second frame folding part 2010b and the third plate 2111c of the first sub frame 202 are not fixed to other elements, and therefore slip in the horizontal direction in response to folding of the bottom case 1000.

Referring to FIG. 3, in some embodiments at least one second sub frame 203 may be further provided between the first sub frame 202 and the bottom case 1000. In FIG. 3, an example in which only a single second sub frame 203 is provided is shown. Alternatively, two or more second sub frames 203 may be provided. In addition, only the main frame 201 and the first sub frame 202 may be provided, and the second sub frame 203 may be omitted.

As shown in FIG. 3, the second support layer 2024*b* of the second sub frame 203 is laminated to the fourth plate 2111*d* of the first sub frame 202 via a fourth adhesive layer 114. The fourth adhesive layer 114 is located only at the region that overlaps the fourth plate 2111*d* and the sixth plate 2111*f*. Consequently, the sixth plate 2111*f* is adhered and fixed to the fourth plate 2111*d*, but the third plate 2111*c* of the first sub frame 202 is not attached to the fifth plate 2111*e* of the second sub frame 203. In addition, the first sub frame 202 is not attached to the third frame folding part 2010*c* of the second sub frame 203. Consequently, the second and third frame folding parts 2010*b* and 2010*c* of the first and second sub frames 202 and 203 are not fixed to other elements, and therefore slip in the horizontal direction in response to folding of the bottom case 1000.

In the case in which only a single second sub frame 203 is provided, one of the plates 2111 of the second sub frame 203 that is located so as to overlap the third adhesive layer 113, i.e. the sixth plate 2111*f*, is laminated to the bottom surface of the bottom case 1000 via a fifth adhesive layer 115.

That is, the second, fourth, and sixth plates 2111*b*, 2111*d*, and 2111*f* are fixed to the bottom surface of the bottom case 1000 via the third adhesive layer 113, the fourth adhesive layer 114, and the fifth adhesive layer 115, respectively. The fifth adhesive layer 115 is also provided only at the region that overlaps the sixth plate 2111*f*. As a result, the second and third frame folding parts 2010*b* and 2010*c* and the third and fifth plates 2111*c* and 2111*e* may move without being fixed to other elements, other than being supported by the support layers 2024*a* and 2024*b*.

Consequently, the protrusion 1005 and the first plate 2111*a* are adhered and fixed to each other, and the second plate 2111*b* is fixed to the bottom surface of the bottom case 1000 via the third adhesive layer 113, whereby the display panel 100 and the main frame 201 are fixed and are thus not movable. In contrast, the first and second sub frames 202 and 203 are folded simultaneously when the bottom case 1000 is folded, and the second and third frame folding parts 2010*b* and 2010*c* and the third and fifth plates 2111*c* and 2111*e* slip due to the force applied at the time of folding, whereby the stress generated at the time of folding is dispersed and thus reduced. Consequently, the foldable display device according to the present invention has the effect of greatly reducing the amount of stress generated at the time of folding due to the slippage of the first and second sub frames 202 and 203.

Meanwhile, although not shown in FIG. 3, a plurality of second sub frames 203 may be provided, as previously described. In this case, one of the plates 2111 of the second sub frame 203 that is located so as to overlap the third adhesive layer 113, i.e. the sixth plate 2111*f*, may be laminated to a support layer (not shown) of another middle frame via the fifth adhesive layer 115. For one of the second sub frames 203 that contacts the bottom case 1000, the plate that overlaps the third adhesive layer 113 may be laminated to the bottom surface of the bottom case via another adhesive layer. Even in this case, the fifth adhesive layer 115 may be formed only at the region that overlaps the sixth plate 2111*f*. As a result, the fifth adhesive layer 115 is not provided at the fifth plate 2111*e* or the third frame folding part 2010*c*. Consequently, the fifth plate 2111*e* and the third frame folding part 2010*c* may slip due to the force applied at the time of folding.

Figure 4:
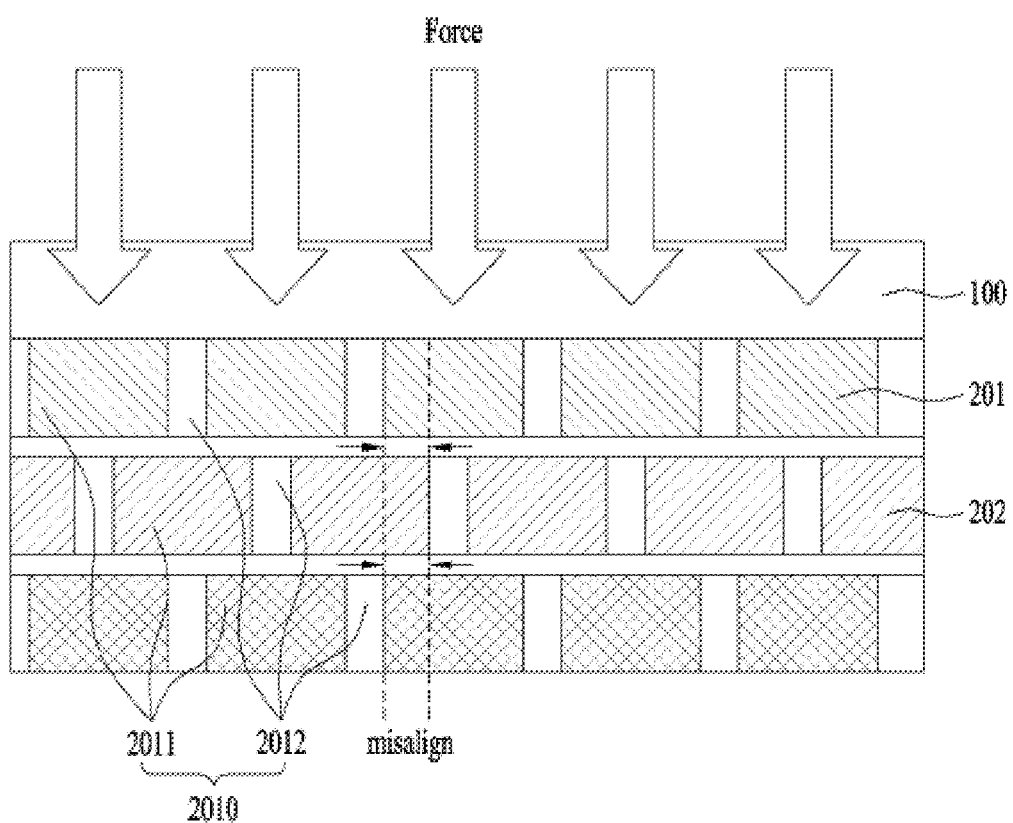
FIG. 4 is a sectional view illustrating the misalignment of opening patterns in the middle frames.

FIG. 4 is a sectional view illustrating the misalignment of the opening patterns 2012 in the middle frames 201, 202, and 203.

In the case in which the opening patterns 2012 in the middle frames 201, 202, and 203 are aligned so as to overlap each other, the force that supports the display panel 100 in the vertical direction may be reduced at the region at which the opening patterns 2012 are aligned. In this case, the region of the display panel 100 corresponding to the opening patterns 2012 may be stepped due to low support force of the opening patterns 2012, whereby the folding part F/A of the flexible display panel 100 may become irregular. For this reason, it is necessary to increase the support force, which is reduced by the opening patterns 2012, by arranging the folding patterns 2011 under the opening patterns 2012. In order words, the opening patterns 2012 in the middle frames 201, 202, and 203 are arranged so as to be purposely misaligned with each other, whereby the foldable display device according to the present invention has the effect of preventing the occurrence of a transfer or distortion phenomenon due to the irregularities of the display panel.

Figure 5:
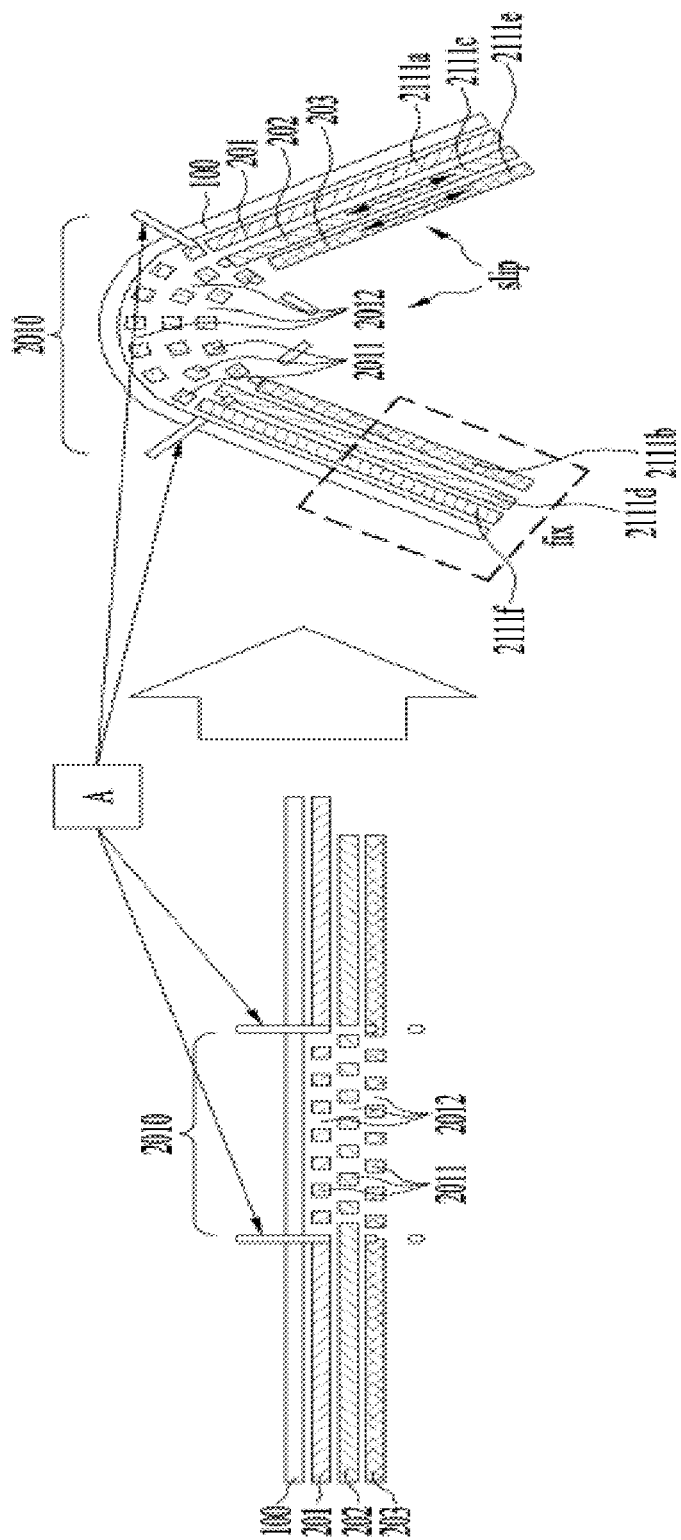
FIG. 5 is a schematic view illustrating a change in the shape of a display panel, a main frame, and sub frames when the foldable display device according to an embodiment of the present invention is folded.

FIG. 5 is a schematic view illustrating a change in the shape of the display panel 100, the main frame 201, and the sub frames 202 and 203 when the foldable display device according to the present invention is folded. For the convenience of description, only the display panel 100, the main frame 201, and the sub frames 202 and 203 are shown, and the adhesive layers and the support layers are omitted.

Referring to the left-side figure of FIG. 5, the main frame 201 and the sub frames 202 and 203 support the display panel 100 in the unfolded state. In particular, the opening patterns 2012 provided at the frame folding parts 2010 are shifted in the horizontal direction so as to be misaligned with each other, whereby at least one of the folding patterns 2011 is located over the entire lower surface of the folding part F/A of the display panel 100. Consequently, the force that supports the display panel 100 in the vertical direction is increased.

Referring to the right-side figure of FIG. 5, the second plate 2111*b* of the main frame 201, the fourth plate 2111*d* of the first sub frame 202, and the sixth plate 2111*f* of the second sub frame 203 are adhered in the folded state to form a fixing part. In contrast, the frame folding parts 2010 and the third and fifth plates 2111*c* and 2111*e* of the first sub frame 202 and the second sub frame 203 are not fixed and thus form slip parts, which independently slip relative to other middle frames. Consequently, the frame folding parts 2010 and the third and fifth plates 2111*c* and 2111*e* of the first sub frame 202 and the second sub frame 203 slip in the horizontal direction due to the force applied at the time of folding.

In the foldable display device according to the present invention, stress generated at the time of folding is applied to the slip parts of the first and second sub frames 202 and 203, whereby the stress is dispersed. Consequently, stress applied to inflection points A at the time of folding is dispersed by the slippage of the slip parts.

In the foldable display device according to the present invention, therefore, the amount of stress generated at the time of folding is effectively reduced, thereby achieving an excellent folding effect.

Although the present invention will hereinafter be described with reference to the foldable display device as an example, the technical concept of the present invention can also be applied to a lighting device.

As is apparent from the above description, the present invention has the following effects.

In the foldable display device according to the present invention, the main frame and the sub frames support the display panel in the unfolded state. In particular, the opening patterns provided at the frame folding parts are shifted in the horizontal direction so as to be misaligned with each other, whereby at least one of the folding patterns is located over the entire lower surface of the folding part of the display panel. Consequently, the amount of force that supports the display panel in the vertical direction is increased.

In the foldable display device according to the present invention, the stress generated at the time of folding is applied to the slip parts of the first and second sub frames, whereby the stress is dispersed. Consequently, the stress applied to the inflection points at the time of folding is dispersed by the slippage of the slip parts. In the foldable display device according to the present invention, therefore, stress generated at the time of folding is effectively reduced, thereby achieving an excellent folding effect.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A foldable display device comprising:
   a display panel comprising at least one folding part and at least two non-folding parts, the at least one folding part between the at least two non-folding parts;
   a plurality of middle frames disposed at a lower surface of the display panel; and
   a bottom case for receiving the display panel and the plurality of middle frames,
   wherein each of the plurality of middle frames comprises at least two flat parts and a frame folding part between the two flat parts, wherein each of the at least two flat parts of each middle frame overlaps a corresponding one of the at least two non-folding parts of the display panel, and wherein the frame folding part of the middle frame overlaps the at least one folding part of the display panel, and wherein one of the plurality of middle frames has a different length than other middle frames from the plurality of middle frames.

2. The foldable display device according to claim 1, wherein the frame folding part comprises a folding pattern comprising a plurality of bars arranged in parallel to a folding axis, about which the display panel is folded, and an opening pattern comprising a plurality of slits alternating with the bars of the folding pattern, and
   the flat part comprises a plurality of plates provided at opposite sides of the folding pattern.

3. The foldable display device according to claim 2, wherein the opening patterns provided at one of the middle frames are misaligned with the opening patterns provided at another one of the middle frames.

4. The foldable display device according to claim 2, wherein the plurality of middle frames comprise:
   a main frame laminated to the lower surface of the display panel via a first adhesive layer; and
   at least one sub frame provided between the main frame and a bottom surface of the bottom case.

5. The foldable display device according to claim 4, wherein the at least one sub frame comprises a support layer disposed at one surface of the frame folding part and one surface of each of the plates for supporting the frame folding part and the plates.

6. The foldable display device according to claim 5, wherein each of the display panel and the main frame comprises an extension extending from one side thereof further than the at least one sub frame.

7. The foldable display device according to claim 6, wherein the bottom case comprises a protrusion protruding toward and supporting the extension of each of the display panel and the main frame.

8. The foldable display device according to claim 7, wherein:
   the main frame comprises a first plate comprising the extension and a second plate located opposite the first plate with the frame folding part disposed between the first plate and the second plate, and
   the extension of the main frame is laminated to the protrusion via a second adhesive layer.

9. The foldable display device according to claim 8, wherein the frame folding part of the at least one sub frame and the plate of the at least one sub frame overlapping the first plate independently slip relative to an adjacent one of the middle frames when the foldable display device is folded along the folding axis.

10. The foldable display device according to claim 8, wherein the at least one sub frame comprises a first sub frame that contacts the main frame, wherein the first sub frame comprises a third plate overlapping the first plate and a fourth plate overlapping the second plate, wherein the fourth plate is laminated to the second plate via a third adhesive layer.

11. The foldable display device according to claim 10, wherein the at least one sub frame further comprises at least one second sub frame provided between the first sub frame and the bottom surface of the bottom case.

12. The foldable display device according to claim 11, wherein the at least one second sub frame comprises a fifth plate overlapping the first plate and a sixth plate overlapping the second plate, wherein the sixth plate is laminated to a plate of an adjacent one of the middle frames via a fourth adhesive layer.

13. The foldable display device according to claim 12, wherein the sixth plate is laminated to an adjacent one of the middle frames via a fifth adhesive layer.

14. The foldable display device according to claim 12, wherein the sixth plate is laminated to the bottom surface of the bottom case via a fifth adhesive layer.

15. The foldable display device according to claim 1, wherein the frame folding part is arranged in parallel with a folding axis of the foldable display device.

16. A foldable display device comprising:
   a display panel including a first folding part, a first non-folding part and a second non-folding part, the first non-folding part extending in a first direction from the first folding part and the second non-folding part extending in a second direction from the first folding part opposite the first direction, the display panel configured to be folded along a folding axis within the first folding part;
   a main frame attached to a lower surface of the display panel, the main frame including a second folding part, a first non-folding plate and a second non-folding plate, the first non-folding plate extending in the first direction from the second folding part and the second non-folding plate extending in the second direction from the second folding part;
   a first sub-frame under the main frame and including a third folding part, a third non-folding plate and a fourth non-folding plate, the third non-folding plate extending in the first direction from the third folding part and the fourth non-folding plate extending in the second direction from the third folding part; and a bottom case for receiving the display panel, the main frame, and the first sub-frame, wherein:

the display panel and the first non-folding plate of the main frame extend longer in the first direction than the third non-folding plate of the first sub-frame;

the fourth non-folding plate of the first sub-frame is attached to the second non-folding plate of the main frame;

the third folding part of the first sub-frame is not attached to the second folding part of the main frame; and the third non-folding plate of the first sub-frame is not attached to the first non-folding plate of the main frame.

17. The foldable display device according to claim 16, wherein the bottom case comprises a protrusion protruding toward and supporting an extension part of the first non-folding plate of the main frame extending longer in the first direction than the third non-folding plate of the first sub-frame.

18. The foldable display device according to claim 17, wherein the extension part of the first non-folding plate of the main frame is attached to the protrusion of the bottom case.

19. The foldable display device according to claim 16, wherein the third folding part and the third non-folding plate of the first sub-frame slip in the first direction relative to the main frame when the foldable display device is folded along the folding axis.

20. The foldable display device according to claim 16, wherein:

the second folding part of the main frame includes a plurality of first bars arranged along the folding axis and a plurality of first slits alternating with the first bars;

the third folding part of the first sub-frame includes a plurality of second bars arranged along the folding axis and a plurality of second slits alternating with the second bars; and the first bars of the main frame are misaligned with the second bars of the first sub-frame.

21. The foldable display device according to claim 16, wherein the first sub-frame includes a support layer disposed on a surface of, and supporting, the third folding part, the third non-folding plate, and the fourth non-folding plate.

* * * * *